US012588302B2

(12) United States Patent
Ai et al.

(10) Patent No.: US 12,588,302 B2
(45) Date of Patent: Mar. 24, 2026

(54) BACKSIDE DEEP TRENCH ISOLATION STRUCTURE FOR LEAKAGE SUPPRESSION

(71) Applicant: OMNIVISION TECHNOLOGIES, INC., Santa Clara, CA (US)

(72) Inventors: Chun-Yung Ai, San Jose, CA (US); Kazufumi Watanabe, Mountain View, CA (US); Chih-Wei Hsiung, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 322 days.

(21) Appl. No.: 18/318,482

(22) Filed: May 16, 2023

(65) Prior Publication Data

US 2024/0387567 A1 Nov. 21, 2024

(51) Int. Cl.
H10F 39/00 (2025.01)
H10F 39/18 (2025.01)

(52) U.S. Cl.
CPC ......... H10F 39/802 (2025.01); H10F 39/807 (2025.01); H10F 39/18 (2025.01); H10F 39/8037 (2025.01)

(58) Field of Classification Search
CPC .......... H10F 39/014; H10F 39/12–813; H10D 62/102; H10D 62/106; H10D 62/107
See application file for complete search history.

(56) References Cited

U.S. PATENT DOCUMENTS

| | | | |
|---|---|---|---|
| 7,821,046 B2 * | 10/2010 | Brady | |
| 9,177,982 B2 | 11/2015 | Mao et al. | |
| 12,046,618 B2 * | 7/2024 | Otake | H10F 77/331 |
| 2009/0140365 A1 | 6/2009 | Lee et al. | |
| 2013/0099341 A1 | 4/2013 | Shim et al. | |
| 2017/0133415 A1 * | 5/2017 | Tsai | H01L 23/58 |
| 2021/0399093 A1 * | 12/2021 | Zheng | H10F 39/807 |
| 2021/0408097 A1 | 12/2021 | Akiyama et al. | |
| 2022/0208808 A1 * | 6/2022 | Kwag | H10F 39/807 |
| 2022/0223635 A1 | 7/2022 | Kao et al. | |
| 2022/0337055 A1 | 10/2022 | Salcedo et al. | |
| 2022/0384662 A1 | 12/2022 | Rascuna' et al. | |

\* cited by examiner

*Primary Examiner* — Christine S. Kim
*Assistant Examiner* — Tien Tran
(74) *Attorney, Agent, or Firm* — Dorsey & Whitney LLP

(57) ABSTRACT

A pixel array substrate includes a semiconductor substrate including a pixel array, a first side, and a second side opposite the first side, a guard ring region in the semiconductor substrate, formed of a doped semiconductor, enclosing the pixel array, and extending into the semiconductor substrate from the first side, and a peripheral region in the semiconductor substrate and enclosing the guard ring region. The peripheral region includes at least one device and a deep trench isolation (DTI) structure region disposed between the guard ring region and the at least one device and proximate to the second side of the semiconductor substrate. The DTI structure region is configured to block an electric current path between a P-N junction in the guard ring region and the at least one device.

22 Claims, 3 Drawing Sheets

BACKSIDE DEEP TRENCH ISOLATION STRUCTURE FOR LEAKAGE SUPPRESSION

TECHNICAL FIELD

This disclosure relates generally to image sensors, and in particular but not exclusively, relates to complementary metal oxide semiconductor (CMOS) image sensors.

BACKGROUND

Image sensors have become ubiquitous and are now widely used in digital cameras, cellular phones, security cameras, as well as in medical, automotive, and other applications. As image sensors are integrated into a broader range of electronic devices, it is desirable to enhance their functionality, performance metrics, and the like in as many ways as possible (e.g., resolution, power consumption, dynamic range) through both device architecture design as well as image acquisition processing. The technology used to manufacture image sensors has continued to advance at a great pace. For example, the demands of higher resolution and lower power consumption have encouraged the further miniaturization and integration of these devices.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to produce digital images (e.g., image data) representing the external scene. The analog image signals on the bitlines are coupled to readout circuits, which include input stages having analog-to-digital conversion (ADC) circuits to convert those analog image signals from the pixel array into the digital image signals.

BRIEF DESCRIPTION OF THE DRAWINGS

Non-limiting and non-exhaustive embodiments of the present disclosure are described with reference to the following figures, wherein like reference numerals refer to like parts throughout the various views unless otherwise specified.

Figure 1:
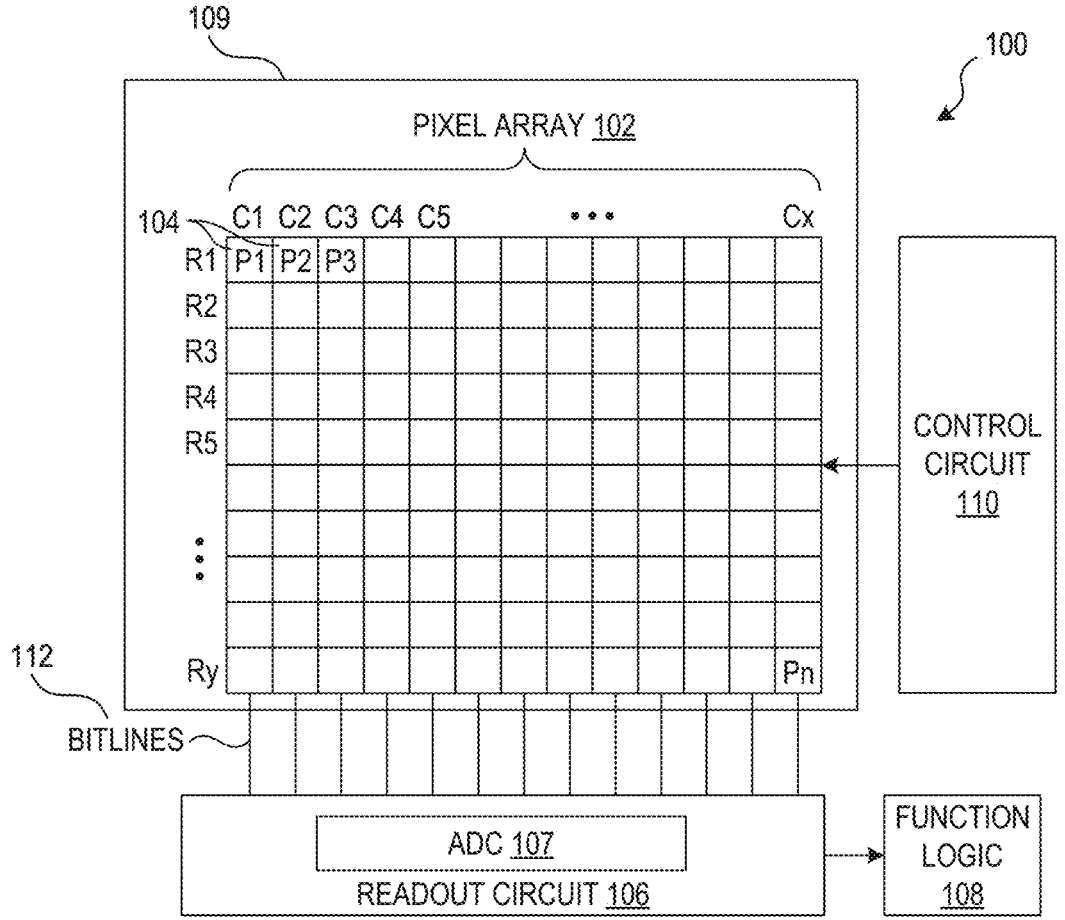
FIG. 1 illustrates one example of an imaging system in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present disclosure. In addition, common but well-understood elements that are useful or necessary in a commercially feasible embodiment are often not depicted in order to facilitate a less obstructed view of these various embodiments of the present disclosure.

DETAILED DESCRIPTION

Examples directed to a pixel array substrate with a backside deep trench isolation structure region providing reduced current leakage are disclosed. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present disclosure. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for case of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

It is appreciated that the term "semiconductor substrate" throughout the disclosure may correspond to a part of or an entirety of a semiconductor wafer (e.g., a silicon wafer). The semiconductor substrate may include or may be otherwise formed of silicon, a silicon germanium alloy, germanium, a silicon carbide alloy, an indium gallium arsenide alloy, any other alloys formed of III-V group compounds, combinations thereof, or a bulk substrate thereof.

As will be discussed, various examples of a pixel array substrate with a deep trench isolation structure region or backside deep trench isolation structure region providing reduced current leakage are disclosed. In various pixel array substrates, a pixel array is enclosed in a guard ring region and one or more devices (e.g., transistors, diodes) are included in a peripheral region outside of the guard ring region. For small pixels (e.g., submicron pixels), a blanket deep N-doped well can be disposed proximate to the backside of the pixel array substrate in order to form deeper photodiode regions and maximize the pixel's full well capacity (FWC) without complicated or difficult manufacturing processes. However, the blanket deep N-doped well can create current leakage paths between the one or more devices in the peripheral region and the pixel array and/or the guard ring region, depending on the bias conditions. The current leakage paths can lead to unnecessary and high power consumption by the imaging system during, for example, standby mode (e.g., low power mode).

It is appreciated that pixel array substrates in accordance with the teachings of the present disclosure include a backside deep trench isolation (DTI) structure region in the peripheral region between the one or more devices and the guard ring region. The pixel array substrate can still include a blanket deep N-doped well for maximizing the FWC of small pixels, because the DTI structure region can block the current leakage paths created by the blanket deep N-doped well.

Thus, as will be shown and described in the various examples below, an example pixel array substrate includes a semiconductor substrate including a pixel array, a front side, and a backside opposite the front side, a guard ring region in the semiconductor substrate, formed of a doped semiconductor, enclosing the pixel array, and extending into the semiconductor substrate from the front side, and a peripheral region in the semiconductor substrate and enclosing the guard ring region. The peripheral region includes at least one device and a deep trench isolation (DTI) structure region disposed between the guard ring region and the at least one device and proximate to the backside of the semiconductor substrate. The DTI structure region is configured to block an electric current path between a P-N junction in the guard ring region and the at least one device.

To illustrate, FIG. 1 shows one example of an imaging system 100 having a pixel array substrate 109 in accordance with the teachings of the present disclosure. In particular, the example depicted in FIG. 1 illustrates an imaging system 100 that includes a pixel array 102 disposed on the pixel array substrate 109, bitlines 112, a control circuit 110, a readout circuit 106, and function logic 108. In one example, pixel array 102 is a two-dimensional (2D) array including a plurality of pixel circuits 104 (e.g., P1, P2, . . . . Pn) that are arranged into rows (e.g., R1 to Ry) and columns (e.g., C1 to Cx) to acquire image data of a person, place, object, etc., which can then be used to render an image of a person, place, object, etc.

In various examples, the readout circuit 106 may be configured to read out the image signals through the column bitlines 112. In the various examples, readout circuit 106 may include an analog-to-digital converter (ADC) 107 in accordance with the teachings of the present disclosure. In the example, the digital image data values generated by the analog to digital converters in readout circuit 106 may then be received by function logic 108. Function logic 108 may simply store the digital image data or even manipulate the digital image data by applying post image effects (e.g., crop, rotate, remove red eye, adjust brightness, adjust contrast, or otherwise).

In one example, control circuit 110 is coupled to pixel array 102 to control operation of the plurality of photodiodes in pixel array 102. For example, control circuit 110 may generate a rolling shutter or a shutter signal for controlling image acquisition. In other examples, image acquisition is synchronized with lighting effects such as a flash.

In one example, imaging system 100 can be implemented on a single semiconductor wafer. In another example, imaging system 100 can be implemented on stacked semiconductor wafers. For example, pixel array 102 and peripheral circuities including pixel driving and/or biasing circuitries can be implemented on a pixel wafer, while readout circuit 106, control circuit 110, and/or function logic 108 can be implemented on an application specific integrated circuit (ASIC) wafer. The pixel wafer and the ASIC wafer can be stacked and interconnected by bonding (hybrid bonding, oxide bonding, or the like) or one or more through substrate vias (TSVs). In yet another example, pixel array 102, peripheral circuities including pixel driving and/or biasing circuitries, and/or control circuit 110 can be implemented on a pixel wafer, while readout circuit 106 and/or function logic 108 can be implemented on an ASIC wafer. The pixel wafer and the ASIC wafer can be stacked and interconnected by bonding (hybrid bonding, oxide bonding, or the like) or one or more TSVs.

In one example, imaging system 100 may be included in a digital camera, cell phone, laptop computer, an endoscope, a security camera, or an imaging device for automobile, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
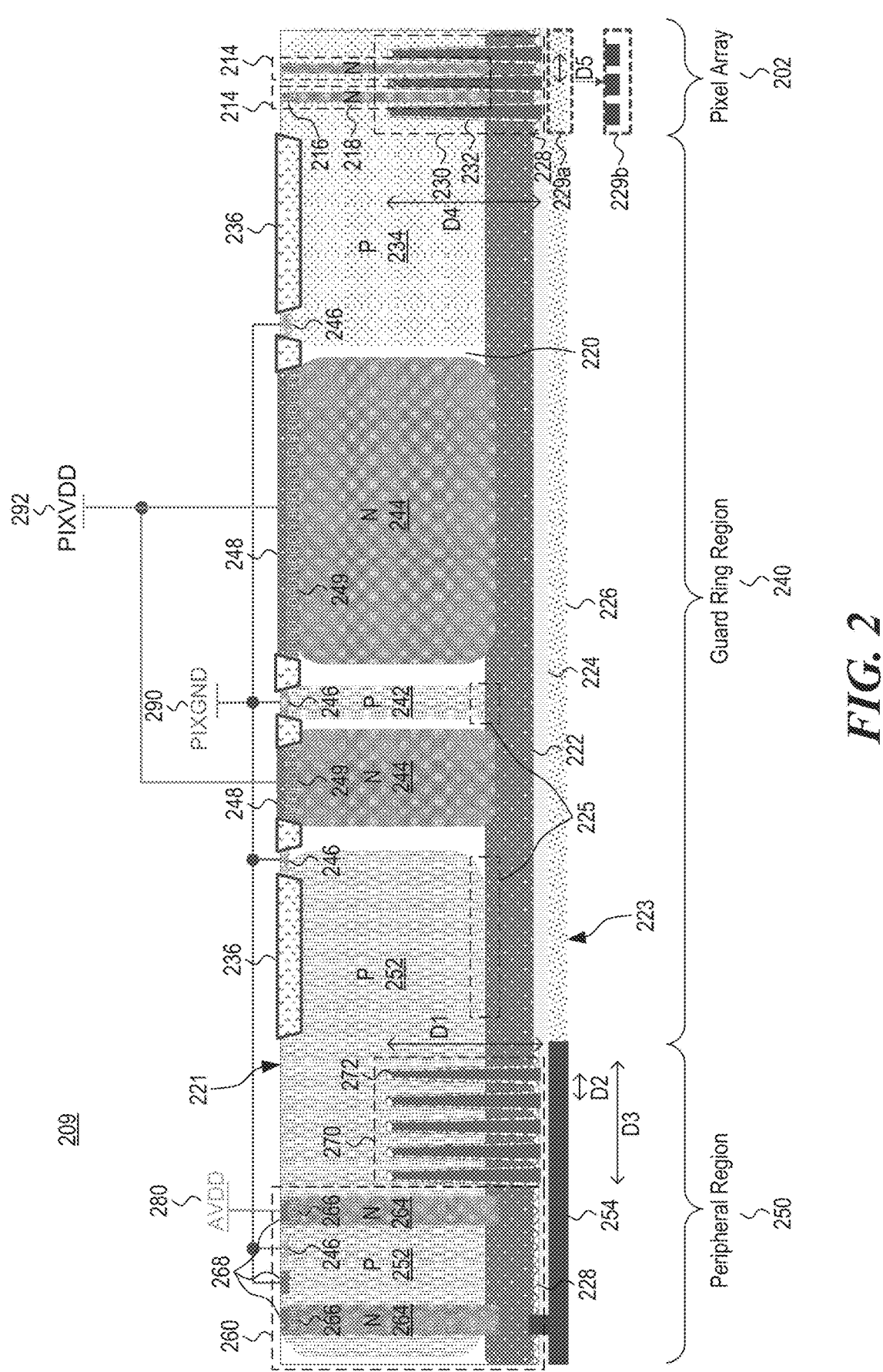
FIG. 2 illustrates a partial cross-section schematic of a pixel array substrate in accordance with the teachings of the present disclosure.

FIG. 2 illustrates a partial cross-section schematic of a pixel array substrate 209 in accordance with the teachings of the present disclosure. It is appreciated that the pixel array substrate 209 of FIG. 2 may be an example of the pixel array substrate 109 included in the imaging system 100 as shown in FIG. 1, and that similarly named and numbered elements described above are coupled and function similarly below.

In the illustrated example, the pixel array substrate 209 includes a semiconductor substrate 220 with a pixel array 202, a front side 221 (first side), and a backside 223 (second side) opposite the front side. In some embodiments, the backside 223 may be an illuminated side of the pixel array substrates 209. The semiconductor substrate 220 may be a silicon substrate and may be doped of a first conductivity type, such as P-type doped silicon substrate. A guard ring region 240, formed of a doped semiconductor, is disposed in the semiconductor substrate 220 and extends into the semiconductor substrate 220 from the front side 221 toward the backside 223. A peripheral region 250 is also disposed in the semiconductor substrate 220 and includes at least one device 260 (e.g., transistor, diode). The pixel array substrate 209 includes a metal grid pattern area 226 disposed on the backside 223, a buffer layer (e.g., oxide layer) 224 disposed between the metal grid pattern area 226 and the semiconductor substrate 220, and a blanket deep N-doped well 222. The blanket deep N-doped well 222, formed of a doped semiconductor, is included to maximize the pixel's full well capacity (FWC) without complicated or difficult manufacturing processes.

The blanket deep N-doped well 222 may be formed by blanket implantation dopant of a second conductivity type from front side 221 across the semiconductor substrate 220. The blanket deep N-doped well 222 may have the second conductivity type that is opposite to the first conductivity type.

Each of the blanket deep N-doped well 222, the buffer layer 224, and the metal grid pattern area 226 can extend across the pixel array 202, the guard ring region 240, and the peripheral region 250. The blanket deep N-doped well 222 may have a uniform dopant concentration across the pixel array 202, the guard ring region 240, and the peripheral region 250. The guard ring region 240 may be arranged to provide isolation between the pixel array 202 and the peripheral region 250. While not visible in the portion of the partial cross-section schematic depicted in FIG. 2, the guard ring region 240 can enclose the pixel array 202 and the peripheral region 250 can enclose the guard ring region 240 in the pixel array substrate 209.

The pixel array 202 includes photodiodes 214, configured to photo-generate image charges in response to incident light, disposed in a first P-type well region 234. Each photodiode 214 may include one or more photodiode doped regions having the opposite conductivity type as that of the semiconductor substrate 220. For example, the one or more photodiode doped regions of photodiode 214 may be doped semiconductor of dopants or impurities having the second conductivity type (e.g., N-type) that is opposite to the first conductivity type (e.g., P-type).

In the illustrated embodiments, each photodiode 214 includes a shallow N-doped region 216 ("shallow photodiode doped region") and a deep N-doped region 218 ("deep photodiode doped region") that extends from the front side 221 through the first P-type well region 234 until the blanket deep N-doped well 222. The shallow N-doped region 216 has a junction depth that is less than a junction depth of the deep N-doped region 218 with respect to the front side 221. The shallow N-doped region 216 may have a higher doping concentration than that of the deep N-doped region 218 and the blanket deep N-doped well 222 to form a photodiode 214 having a suitable potential curve between the front side 221 and the backside 223 that maximizes the corresponding full well capacity and mitigates transfer lag issues.

Each of the shallow N-doped region 216 and the deep N-doped region 218 can have the same conductivity type as the blanket deep N-doped well 222. That is, the shallow N-doped region 216, the deep N-doped region 218, and the blanket deep N-doped well 222 can all be formed of dopants or impurities of a second conductivity type that is opposite to the first conductivity type of the first P-type well region 234. For example, the shallow N-doped region 216, the deep N-doped region 218, and the blanket deep N-doped well 222 may each be formed of a semiconductor doped with N-type dopants such as phosphorus and arsenic.

It is appreciated that in the illustrated embodiments, the blanket deep N-doped well 222 is of an N-doped doped region (i.e., the same conductivity type as the photodiode doped regions of photodiode 214, but opposite to the first conductivity type of the semiconductor substrate 220). However, in other embodiments, the polarity may be reversed (i.e., the blanket deep N-doped well 222, the shallow N-doped region 216, and the deep N-doped region 218 of photodiode 214 may be formed of P-type, while the first P-type well region 234 and the semiconductor substrate 220 may be of N-type).

The blanket deep N-doped well 222 may be disposed in the semiconductor substrate 220 between deep N-doped region 218 of each respective photodiode 214 and the backside 223 of the semiconductor substrate 220. The blanket deep N-doped well 222 may overlap with the deep N-doped region 218 in a depth-wise direction or otherwise be electrically connected to the deep N-doped region 218. The shallow N-doped region 216, the deep N-doped region 218, and corresponding portions of the blanket deep N-doped well 222 may collectively form an N-type doped region for the respective photodiode 214.

The pixel array 202 can further include high-k passivation 228 disposed between the backside 223 of the semiconductor substrate 220 and the buffer layer 224. The high-k passivation 228 may be formed from one or more layers that have a dielectric constant greater than 3.9, such as aluminum oxide, hafnium oxide, tantalum oxide, zirconium oxide, and the like. In some embodiments, the pixel array 202 may further include an anti-reflective (AR) layer disposed between the high-k passivation 228 and buffer layer 224 for reducing reflection and increasing light transmittance. The AR layer may be formed of material such as tantalum oxide.

The metal grid pattern area 226 can have alternative patterns 229a and 229b disposed in the pixel array 202 region that form a plurality of apertures aligned with each of the photodiodes 214 providing optical isolation. The alternative patterns 229a and 229b may be disposed in an array of color filters separating adjacent color filters.

The pixel array 202 can also include a pixel array deep trench isolation (DTI) structure region 230 disposed proximate to the backside 223 and extending from the backside 223 toward the front side 221. The pixel array DTI structure region 230 including a plurality of DTI structures 232. Individual ones of the DTI structures 232 can be configured to be disposed between adjacent ones of the deep N-doped regions 218 of the photodiodes 214 and to isolate each of the photodiodes in the semiconductor substrate 220.

The pixel array deep trench isolation (DTI) structure region 230 can be formed such that the high-k passivation 228 surrounds each DTI structure 232. Each DTI structure 232 and the surrounding high-k passivation 228 may be deposited in a corresponding trench structure such that the high-k passivation 228 is between each respective DTI structure 232 and the semiconductor substrate 220. The high-k passivation 228 may cover surface regions of the backside 223 of the semiconductor substrate 220 between adjacent DTI structures 232. Each DTI structure 232 may comprise of one or more dielectric materials (e.g., silicon oxide or a dielectric material having a refractive index lower than that of the semiconductor substrate 220) and/or conductive materials (e.g., tungsten, aluminum, polysilicon). Each DTI structure 232 can have an isolation depth D4 with respect to the backside 223 and can be separated by a spacing D5. Individual ones of the DTI structures 232 may be arranged to extend from the backside 223 into the semiconductor substrate through the blanket deep N-doped well 222 to the isolation depth D4, separating the blanket deep N-doped well 222 within pixel array 202 into a plurality of N-doped well portions that are electrically isolated from each other. Each of plurality of N-doped well portions is in between the deep N-doped region 218 of each respective photodiode 214 and the backside 223 of the semiconductor substrate 220, and contributes to an overall full well capacity of each respective photodiode 214. In various examples, the isolation depth D4 can vary among individual DTI structures 232 and the spacing D5 can also vary among different adjacent ones of the DTI structures 232.

The guard ring region 240 may include a plurality of first doped regions and a plurality of second doped regions alternately arranged. The first doped regions and the second doped regions are arranged to have different conductivity types forming one or more P-N junctions in a lateral manner across the guard ring region 240 along a direction that is parallel to the front side 221, providing isolation between the pixel array 202 and the peripheral region 250.

Each of the first doped regions may further include a first heavily doped region and a doped well region, each having the same conductivity type such as the first conductivity type (e.g., P-type). The first heavily doped region and the doped well region may be arranged in the depth-wise direction between the front side 221 and the backside 223 of the semiconductor substrate 220, with the first heavily doped region being formed or otherwise disposed in the doped well region. The first heavily doped region may have a dopant concentration greater than that of the doped well region.

Each of the second doped regions may further include a second heavily doped region, a shallow doped region, and a deep doped region arranged in the depth-wise direction between the front side 221 and the backside 223 of the semiconductor substrate 220. The shallow doped region may be formed between the second heavily doped region and the deep doped region. The second heavily doped region, the shallow doped region, and the deep doped region are of the second conductivity type (e.g., N-type), but may have different dopant concentrations. For example, the second heavily doped region may have greater dopant concentration than that of the shallow doped region and the deep doped region.

In the illustrated embodiments, the guard ring region 240 includes N+ doped regions 248 disposed on the front side 221, shallow N-doped regions 249 beneath the N+ doped regions 248, and deep N-doped regions 244 that extend through the semiconductor substrate 220 until the blanket deep N-doped well 222. In the illustrated embodiment, each of the N+ doped regions 248, the shallow N-doped regions 249, and the deep N-doped regions 244 has the same second conductivity type as the blanket deep N-doped well 222 (i.e., all are formed of dopants or impurities having the second conductivity type). For example, the N+ doped regions 248, the shallow N-doped regions 249, and the deep N-doped regions 244 may be formed of N-type dopants such as phosphorus and arsenic.

The deep N-doped regions 244 may be in direct contact with the blanket deep N-doped well 222. The shallow N-doped regions 249 may be disposed between the N+ doped regions 248 and the deep N-doped regions 244. N+ doped regions 248 may have a dopant concentration that is greater than that of each of the shallow N-doped regions 249, the deep N-doped regions 244, and the blanket deep N-doped well 222.

The guard ring region 240 further includes a second P-type well region 242. The guard ring region 240 may share the first P-type well region 234 with the pixel array 202, and share a third P-type well region 252 with the peripheral region 250. P+ doped regions 246 are formed or otherwise disposed in the P-type well regions 234, 242, 252 proximate to the front side 221. The N+ doped regions 248 are each coupled to a pixel voltage PIXVDD 292 and the P+ doped regions 246 are coupled to a pixel ground voltage level PIXGND 290. The guard ring region 240 also includes multiple shallow trench isolation (STI) structures 236 disposed on the front side 221 and configured to isolate the various regions.

At least one of the multiple shallow trench isolation (STI) structures 236 may be disposed in a well region having the first conductivity type (e.g., first P-type well region 234, third P-type well region 252). Each of the multiple shallow trench isolation (STI) structures 236 may have a structure depth that is at least greater than a junction depth of each respective shallow N-doped region 249. Each of the second and third P-type well regions 242, 252 may extend between the front side 221 and the backside 223 of the semiconductor substrate 220. The second and third P-type well regions 242, 252 and the blanket deep N-doped well 222 interface to form P-N junctions 225, which can potentially cause current leakage paths in the pixel array substrate 209 as the blanket deep N-doped well 222 may electrically couple the deep N-doped regions 244 in the guard ring region 240.

The peripheral region 250 includes the at least one device 260 (e.g., potential doped devices such as potential diode) formed in the third P-type well region 252. Each device 260 may include N+ doped regions 268 disposed on the front side 221, shallow N-doped regions 266 beneath the N+ doped regions 268, and deep N-doped regions 264 that extend through the third P-type well region 252 until the blanket deep N-doped well 222 such that each of the deep N-doped regions 264 may electrically connect to the blanket deep N-doped well 222. The N+ doped regions 268, the shallow N-doped regions 266, and the deep N-doped regions 264 may be electrically coupled to one another. Each device may also include the P+ doped region 246 disposed within the third P-type well region 252. The peripheral region 250 may also include a backside metal 254 disposed in the metal grid pattern area 226 and configured to ground the semiconductor substrate 220. The backside metal 254 may cover the peripheral region 250 in its entirety. One or more of the N+ doped regions 268 may be coupled to a voltage source AVDD 280 to receive a bias voltage. The bias voltage provided by the voltage source AVDD 280 may be different from the pixel voltage PIXVDD 292. The bias voltage provided by the voltage source AVDD 280 may be greater than the pixel ground voltage level, leading to the formation of one or more P-N junction leakage paths. In conventional imaging systems, current would leak between the devices 260 in the peripheral region 250 and the guard ring region 240 via, for example, the P-N junctions 225 in the guard ring region 240 through the blanket deep N-doped well 222.

To block such current leakage, the pixel array substrate 209 in accordance with the teachings of the present disclosure includes a deep trench isolation (DTI) structure region or backside deep trench isolation (BDTI) structure region 270 disposed in the peripheral region 250 between the devices 260 and the guard ring region 240, and proximate to the back side 223. The BDTI structure region 270 effectively divides the blanket deep N-doped well 222 into a first sub-doped well portion extending across the at least one device 260 in the peripheral region 250 and a second sub-doped well portion extending across the guard ring region 240. The first sub-doped well portion extending across the at least one device 260 in the peripheral region 250 and the second sub-doped well portion extending across the guard ring region 240 are structurally separated and electrically isolated from each other. The division of the blanket deep N-doped well 222 into the first and second sub-doped well portions can reduce or prevent current leakage between the devices 260 and the guard ring region 240, such as by separating the deep N-doped regions 264 of the devices 260 in the peripheral region 250 from the deep N-doped regions 244 in the guard ring region 240, and/or blocking one or more electric current paths between the P-N junctions 225 in the guard ring region 240 and the devices 260, thereby avoiding unnecessary power consumption by the imaging system during, for example, standby mode (e.g., low power mode).

In some embodiments, the BDTI structure region 270 may be disposed to enclose the guard ring region 240. In some embodiments, the BDTI structure region 270 may be disposed to enclose at least one device 260 in the peripheral region 250 or enclose all of the devices 260 to effectively disconnect one or more electric current paths between the P-N junctions 225 in the guard ring region 240 and the devices 260.

The BDTI structure region 270 can include a plurality of BDTI structures 272. In some embodiments, the BDTI structures 272 may be structurally interconnected to form a grid. In such embodiments, the plurality of DTI structures 232 may also form an isolation grid providing isolation within pixel array 202. The BDTI structure region 270 can be formed such that the high-k passivation 228 surrounds each BDTI structure 272. The BDTI structure region 270 is structurally disconnected from the pixel array DTI structure region 230.

Each BDTI structure 272 and the surrounded the high-k passivation layer 228 may be deposited in a corresponding trench structure such that the respective section of high-k passivation layer 228 is between each respective BDTI structure 272 and the semiconductor substrate 220. The high-k passivation layer 228 may be disposed between the BDTI structure 272 and the semiconductor substrate 220. The fill material may comprise a dielectric material (e.g., silicon oxide or a dielectric material having a refractive index lower than that of the semiconductor substrate 220) and/or a conductive material (e.g., tungsten, aluminum, or polysilicon). The high-k passivation 228 may cover surface regions of the backside 223 of the semiconductor substrate 220 between adjacent BDTI structures 272. In the illustrated embodiment, the high-k passivation layer 228 may be configured to continuously extend over and cover surface regions of the backside 223 across the pixel array 202, the guard ring region 240, and the peripheral region 250.

Each BDTI structure 272 can have an isolation depth D1 with respective to backside 223 and can be separated by a spacing D2. The BDTI structure region 270 as a whole can have a width D3 (e.g., at least 5 μm, at least 10 μm, at least 20 μm). In various examples, the isolation depth D1 can vary among individual BDTI structures 272 and the spacing D2 can also vary among different adjacent ones of the BDTI structures 272. In some embodiments, the isolation depth D1 that each BDTI structure 272 extends is greater than a junction depth of the blanket deep N-doped well 222 with respect to the backside 223 of the semiconductor substrate 220. In some embodiments, the isolation depth D1 that each BDTI structure 272 extends is greater than an interface depth between the blanket deep N-doped well 222 and the third P-type well region 252. Within the region of the BDTI structure region 270, the blanket deep N-doped well 222 may be separated or divided into a plurality of N-doped well portions that are electrically isolated from each other. Each of the plurality of N-doped well portions may have a doped well region width being substantively the same as the spacing D2 between adjacent BDTI structures 272. In some embodiments, the plurality of BDTI structures 272 included in the BDTI structure region 270 can have similar or identical structure characteristics as the plurality of DTI structures 232 included in the pixel array DTI structure region 230. For example, the BDTI structure isolation depth D1 can be similar or identical to the pixel array DTI structure isolation depth D4, and/or the BDTI structure spacing D2 can be similar or identical to the pixel array DTI structure spacing D5. By having similar or identical structural characteristics, the pixel array DTI structure region 230 and the BDTI structure region 270 can be more easily and cost-effectively manufactured because a common DTI pattern insertion can be used for the entire pixel array substrate 209 using a common patterned photoresist mask.

In some embodiments, the BDTI structure region 270 can include one or more individual BDTI structures 272 disposed between the guard ring region 240 and the at least one devices 260 in the peripheral region 250 to effectively divide the blanket deep N-doped well 222 into the first sub-doped well portion extending across the at least one device 260 in the peripheral region 250 and the second sub-doped well portion extending across the guard ring region 240. The first sub-doped well portion extending across the at least one device 260 in the peripheral region 250 and the second sub-doped well portion extending across the guard ring region 240 may be electrically isolated from each other.

For example, a single BDTI structure 272 with sufficient structural width (e.g., at least 1 μm) may be disposed to surround the guard ring region 240 to minimize the amount of substrate space needed. In another example, multiple BDTI structures 272 may be separately disposed and spaced apart with appropriate spacing (e.g., spacing D2) to surround or otherwise enclose the guard ring region 240, rather than forming a structurally interconnected grid, to block the aforementioned current leakage between the devices 260 in the peripheral region 250 and the guard ring region 240. In some embodiments, separate BDTI structures 272 may be spaced apart by a spacing (e.g., spacing D2) that is the same as the spacing D5 between adjacent DTI structures 232 of the pixel array DTI structure region 230. Each of the separate BDTI structures 272 may have similar or identical structural characteristics as each of the DTI structures 232 of the pixel array DTI structure region 230. In some embodiments, the separate BDTI structures 272 of the BDTI structure region 270 can be formed by the same process as the DTI structures 232 of the pixel array DTI structure region 230, such as by using the same patterned photoresist mask to reduce fabrication costs.

In some embodiments, the deep N-doped regions 244 can be removed or omitted from the pixel array substrate 209 to further disconnect the current leakage paths between the guard ring region 240 and the one or more devices 260 disposed in the peripheral region 250 and reduce power consumption.

Figures 3A, 3B, 3C:
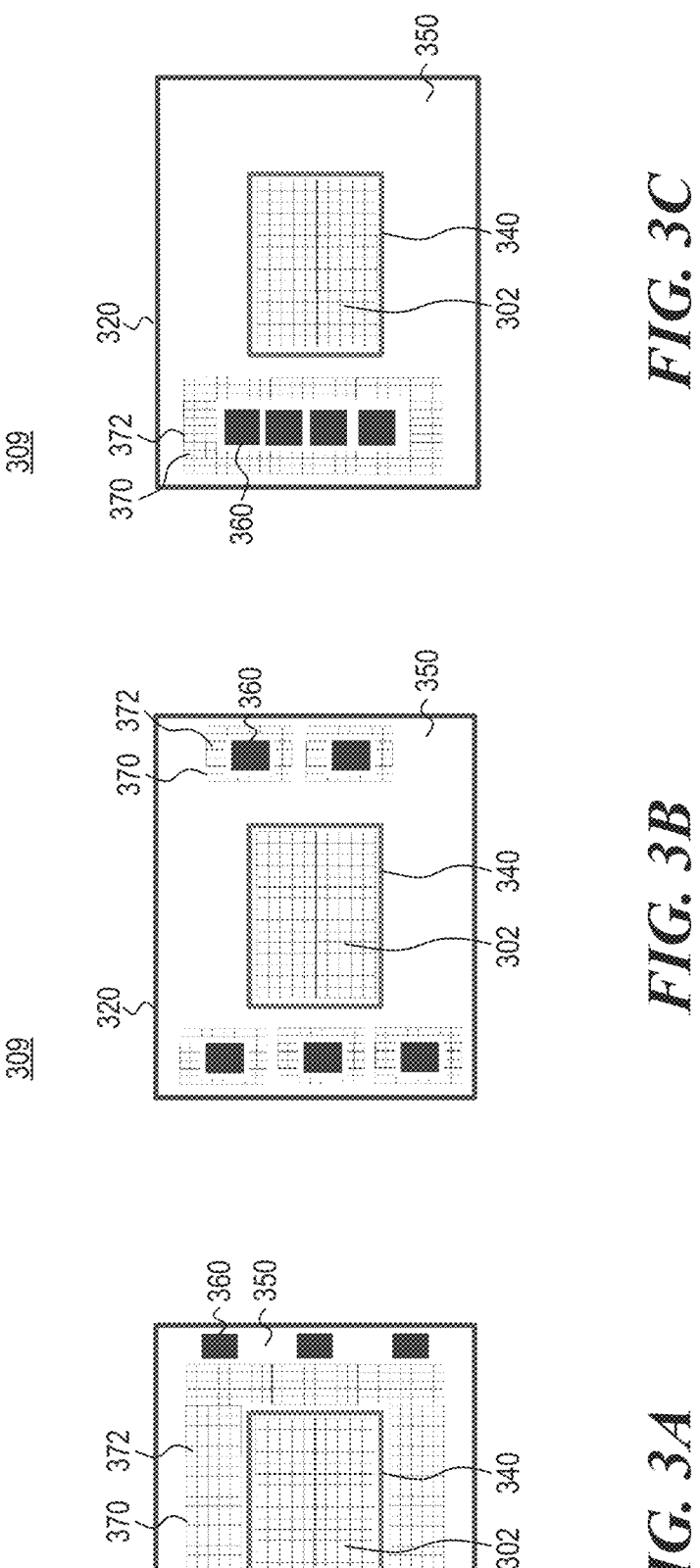
FIGS. 3A-C illustrate top-down views of example pixel array substrates in accordance with the teachings of the present disclosure.

FIGS. 3A-C illustrate top-down views of example pixel array substrates 309 in accordance with the teachings of the present disclosure. It is appreciated that the pixel array substrates 309 of FIGS. 3A-C may be examples of the pixel array substrate 209 as shown in FIG. 2, and that similarly named and numbered elements described above are coupled and function similarly below.

In the illustrated examples, each pixel array substrate 309 includes a pixel array 302 disposed in the substrate 309 and a guard ring region 340 generally enclosing the pixel array 302 on all sides. The guard ring region 340 defines a peripheral region 350 on the opposite side of the pixel array 302. Each pixel array substrate 309 also includes a plurality of devices 360 disposed in the peripheral region 350 and a BDTI structure region 370 with one or more BDTI structures 372 (illustrated as individual rectangles that may or may not form a grid). The BDTI structure region 370 can be separated and disconnected from a pixel array BDTI structure region (e.g., pixel array BDTI structure region 230) in the pixel array 302. In the illustrated examples, the BDTI structure region 370 is at least separated from the pixel array BDTI structure region by junction-formed guard ring structures in the guard ring region 340. As discussed above with respect to FIG. 2, the BDTI structure region 370 can block current leakage paths in a blanket deep N-doped well (e.g., the blanket deep N-doped well 222) between the devices 360 and the guard ring region 340. As will be discussed in further detail below, the BDTI structure region 370 can be formed on the backside of the pixel array substrates 309 in various patterns. The backside may be an illuminated side of the pixel array substrates 309.

Referring to FIG. 3A, the BDTI structure region 370 is formed around the pixel array 302 and the guard ring region 340, but not around the devices 360 in the peripheral region 350. The BDTI structure region 370 is still disposed between the devices 360 and the guard ring region 340 and can block current leakage paths between the devices 360 and the guard ring region 340. Referring to FIG. 3B, the BDTI structure region 370 is formed around individual devices 360, but not around the pixel array 302 and the guard ring region 340. The BDTI structure regions 370 are still disposed between the devices 360 and the guard ring region 340 and can block current leakage paths between the devices 360 and the guard ring region 340. Referring to FIG. 3C, the BDTI structure region 370 is formed around multiple devices grouped together, but not around the pixel array 302 and the guard ring region 340. The BDTI structure region 370 is still disposed between the devices 360 and the guard ring region 340 and can block current leakage paths between the devices 360 and the guard ring region 340.

It is appreciated from FIGS. 3B and 3C that the devices 360 can be grouped into multiple groups and that multiple BDTI structure regions 370 can surround each group of devices 360 or each individual device 360. It is appreciated that the layouts illustrated in FIGS. 3A-C can be combined in various ways. For example, the BDTI structure region 370 can cover the entire peripheral region 350 such that the BDTI structure region 370 surrounds the pixel array 302, the guard ring region 340, and the devices 360. It is further appreciated that other layouts of the BDTI structure region 370 can be used.

It is appreciated that in some embodiments, instead of the illustrated embodiments of the BDTI structure region 370 that includes a plurality of BDTI structures 372 structurally interconnected forming a grid, one or more separately disposed BDTI structures 372 may be employed to surround or otherwise enclose the guard ring region 340, or surround or otherwise enclose each group of devices 360 or each individual device 360 to block current leakage paths between the devices 360 and the guard ring region 340 while minimizing the space needed in the peripheral region 350. For example, a single BDTI structure 372 can be disposed to surround or otherwise enclose the guard ring region 340, or surround or otherwise enclose each group of devices 360 or each individual device 360. In another example, a plurality of BDTI structure 372 may be separately disposed with appropriate spacing in between to surround or otherwise enclose the guard ring region 340.

In various examples, the materials and the dimensions of the BDTI structure region(s) 370 (e.g., the width) and of the individual BDTI structures 372 (e.g., trench or isolation depth, spacing), as well as the number of BDTI structures 372 can be individually configured based on specific demands of the imaging system such as leakage level, substrate or wafer space available, and/or process capabilities.

The above description of illustrated examples of the disclosure, including what is described in the Abstract, is not intended to be exhaustive or to limit the disclosure to the precise forms disclosed. While specific examples of the disclosure are described herein for illustrative purposes, various modifications are possible within the scope of the disclosure, as those skilled in the relevant art will recognize.

These modifications can be made to the disclosure in light of the above detailed description. The terms used in the following claims should not be construed to limit the disclosure to the specific examples disclosed in the specification. Rather, the scope of the disclosure is to be determined entirely by the following claims, which are to be construed in accordance with established doctrines of claim interpretation.

What is claimed is:

1. A pixel array substrate, comprising:
a semiconductor substrate including a pixel array, a first side, and a second side opposite the first side;
a guard ring region in the semiconductor substrate, formed of a doped semiconductor, enclosing the pixel array, and extending into the semiconductor substrate from the first side; and
a peripheral region in the semiconductor substrate and enclosing the guard ring region, wherein the peripheral region includes:
at least one device; and
a deep trench isolation (DTI) structure region disposed between the guard ring region and the at least one device and proximate to the second side of the semiconductor substrate,
wherein the DTI structure region is configured to block an electric current path between a P-N junction in the guard ring region and the at least one device.

2. The pixel array substrate of claim 1, further comprising a blanket deep doped well proximate to the second side of the semiconductor substrate, wherein the blanket deep doped well extends across the pixel array, the guard ring region, and the peripheral region.

3. The pixel array substrate of claim 2, wherein the DTI structure region is configured to divide the blanket deep doped well into a first sub-doped well portion extending across the at least one device and a second sub-doped well portion extending across the guard ring region.

4. The pixel array substrate of claim 2, wherein the DTI structure region is configured to extend from the second side of the semiconductor substrate to an isolation depth, and wherein the isolation depth is deeper than a thickness of the blanket deep doped well with respect to the second side.

5. The pixel array substrate of claim 2, wherein the at least one device comprises a doped region configured to extend from the first side and contact the blanket deep doped well, wherein the doped region of the at least one device and the blanket deep doped well are of a same conductivity type.

6. The pixel array substrate of claim 2, wherein the guard ring region includes a shallow doped region having a first junction depth and a deep doped region having a second junction depth, wherein the second junction depth is greater than the first junction depth with respect to the first side, and wherein the deep doped region extends between the shallow doped region and the blanket deep doped well.

7. The pixel array substrate of claim 6, wherein the deep doped region is in direct contact with the blanket deep doped well, wherein the shallow doped region, the deep doped region, and the blanket deep doped well are of a same conductivity type.

8. The pixel array substrate of claim 1, further comprising a high-k passivation layer proximate to the second side of the semiconductor substrate, wherein the high-k passivation layer extends across the peripheral region, the guard ring region, and the DTI structure region.

9. The pixel array substrate of claim 1, wherein the DTI structure region is configured to enclose the guard ring region.

10. The pixel array substrate of claim 1, wherein the at least one device includes a plurality of devices, and wherein the DTI structure region is configured to enclose each of the devices.

11. The pixel array substrate of claim 1, wherein the at least one device includes a plurality of devices, and wherein the DTI structure region is configured to enclose the at least one device.

12. The pixel array substrate of claim 1, wherein the DTI structure region comprises a plurality of DTI structures interconnected in a grid.

13. The pixel array substrate of claim 1, wherein the DTI structure region comprises a plurality of DTI structures spaced apart from each other.

14. A pixel array substrate, comprising:
    a semiconductor substrate including a pixel array, a first side, and a second side opposite the second side, wherein the pixel array includes:
        a plurality of photodiodes; and
        a first deep trench isolation (DTI) structure region disposed proximate to the second side of the semiconductor substrate, wherein the first DTI structure region includes a first plurality of DTI structures;
    a guard ring region in the semiconductor substrate enclosing the pixel array, and extending into the semiconductor substrate from the first side; and
    a peripheral region in the semiconductor substrate and enclosing the guard ring, wherein the peripheral region includes:
        at least one device; and
        a second DTI structure region disposed between the guard ring region and the at least one device and proximate to the second side of the semiconductor substrate,
    wherein the first DTI structure region is configured to isolate each of the plurality of photodiodes in the semiconductor substrate, and
    wherein the second DTI structure region is configured to block an electric current path between P-N junction guard rings in the guard ring region and the at least one device.

15. The pixel array substrate of claim 14, wherein the first DTI structure region and the second DTI structure region are configured to extend from the second side to a common isolation depth.

16. The pixel array substrate of claim 14, wherein the first DTI structure region is configured to extend from the second side to a first isolation depth, and wherein the second DTI structure region is configured to extend from the second side of the semiconductor substrate to a second isolation depth different from the first isolation depth.

17. The pixel array substrate of claim 14, wherein the second DTI structure region comprises a second plurality of DTI structures, wherein adjacent ones of the first plurality of DTI structures are configured to be spaced apart by a common spacing distance, and wherein adjacent ones of the second plurality of DTI structures are configured to be spaced apart by the common spacing distance.

18. The pixel array substrate of claim 14, wherein each of the photodiodes includes a photodiode doped region configured to extend from the first side, and wherein individual ones of the first plurality of DTI structures are configured to be disposed between adjacent ones of photodiode doped regions of the photodiodes.

19. The pixel array substrate of claim 18, further comprising a blanket deep doped well proximate to the second side of the semiconductor substrate extending across the pixel array, the guard ring region, and the peripheral region, wherein the blanket deep doped well has a conductivity type same as a conductivity type of the photodiode doped region, wherein the second DTI structure region is configured to divide the blanket deep doped well into a first sub-doped well portion extending across the peripheral region and a second sub-doped well portion extending across the guard ring region.

20. An imaging system, comprising:
    a semiconductor substrate including a pixel array, a first side, and a second side opposite the first side;
    a guard ring region in the semiconductor substrate enclosing the pixel array; and
    a peripheral region in the semiconductor substrate and enclosing the guard ring region, wherein the peripheral region includes:
        at least one device comprising a doped region; and
        a deep trench isolation (DTI) structure disposed between the guard ring region and the at least one device and proximate to the second side of the semiconductor substrate; and
        a blanket deep doped well disposed proximate to the second side of the semiconductor substrate extending across the pixel array, the guard ring region, and the peripheral region, wherein the doped region extending from the first side and in contact with the blanket deep doped well,
    wherein the DTI structure is configured to extend through the blanket deep doped well separating the blanket deep doped well into a first sub-doped well portion extending across the peripheral region and a second sub-doped well portion extending across the guard ring region, and to block an electric current path between a P-N junction in the guard ring region and the doped region of the at least one device.

21. The imaging system of claim 20, wherein the DTI structure is configured to enclose the guard ring region.

22. The imaging system of claim 20, wherein the at least one device includes a plurality of devices, and wherein the DTI structure is configured to enclose all of the devices.

* * * * *